(12) United States Patent
Chang et al.

(10) Patent No.: US 9,066,413 B2
(45) Date of Patent: Jun. 23, 2015

(54) PLASMA GENERATION APPARATUS

(71) Applicant: KOREA ADVANCED INSTITUTE OF SCIENCE AND TECHNOLOGY, Daejeon (KR)

(72) Inventors: Hong-Young Chang, Daejeon (KR); Sanghyuk An, Daejeon (KR); Jinwon Lee, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 14/082,795

(22) Filed: Nov. 18, 2013

(65) Prior Publication Data

US 2014/0077700 A1    Mar. 20, 2014

Related U.S. Application Data

(63) Continuation of application No. PCT/KR2012/002179, filed on Mar. 26, 2012.

(30) Foreign Application Priority Data

May 19, 2011    (KR) ........................ 10-2011-0047538

(51) Int. Cl.
    *H01J 7/24*      (2006.01)
    *H05B 41/36*    (2006.01)
    (Continued)

(52) U.S. Cl.
    CPC . *H05H 1/24* (2013.01); *H05H 1/46* (2013.01); *H05H 2001/4667* (2013.01); *H05H 2001/4682* (2013.01); *H01J 37/321* (2013.01); *H01J 37/32174* (2013.01)

(58) Field of Classification Search
    USPC ......................................... 315/111.21, 111.51
    See application file for complete search history.

(56) References Cited

U.S. PATENT DOCUMENTS 5,846,883 A * 12/1998 Moslehi ....................... 438/711
6,259,209 B1 * 7/2001 Bhardwaj et al. ........ 156/345.12

(Continued)

FOREIGN PATENT DOCUMENTS

JP        08-008096           1/1996
KR    10-2001-0093439       10/2001

(Continued)

OTHER PUBLICATIONS

International Search Report for Application No. PCT/KR2012/002179 dated Oct. 4, 2012.

*Primary Examiner* — Douglas W Owens
*Assistant Examiner* — Srinivas Sathiraju
(74) *Attorney, Agent, or Firm* — Jenkins, Wilson, Taylor & Hunt, P.A.

(57) ABSTRACT

A plasma generation apparatus includes a vacuum container, dielectrics connected to through-holes formed in the vacuum container, RF coils of the same structure disposed in the vicinity of the respective dielectrics and electrically connected in parallel, an RF power source to supply power to the RF coils, an impedance matching circuit disposed between the RF power source and the RF coils, and a power distribution unit disposed between the impedance matching circuit and one ends of the RF coils to distribute the power of the RF power source to the RF coils. The power distribution unit includes a power distribution line and a conductive outer cover enclosing the power distribution line. Distance between an input end of the power distribution unit and the RF coils are equal to each other, and the other ends of the RF coils are connected to the conductive outer cover to be grounded.

4 Claims, 17 Drawing Sheets

(51) Int. Cl.
*H05H 1/24* (2006.01)
*H05H 1/46* (2006.01)
*H01J 37/32* (2006.01)

(56) References Cited

U.S. PATENT DOCUMENTS

| | | | |
|---|---|---|---|
| 6,451,161 B1 * | 9/2002 | Jeng et al. | 156/345.48 |
| 6,792,889 B2 * | 9/2004 | Nakano et al. | 118/723 E |
| 7,183,716 B2 * | 2/2007 | Kanarov et al. | 315/111.51 |
| 7,952,048 B2 * | 5/2011 | Choi et al. | 219/121.57 |
| 8,169,148 B2 * | 5/2012 | Jeon et al. | 315/111.21 |
| 2003/0015965 A1 * | 1/2003 | Godyak | 315/111.21 |
| 2005/0001556 A1 * | 1/2005 | Hoffman et al. | 315/111.91 |

FOREIGN PATENT DOCUMENTS

| | | |
|---|---|---|
| KR | 10-2007-0062708 | 6/2007 |
| KR | 10-2009-0005542 | 1/2009 |
| KR | 10-2009-0108730 | 10/2009 |
| WO | WO 2012/157844 | 11/2012 |

* cited by examiner

PLASMA GENERATION APPARATUS

CROSS-REFERENCE TO RELATED APPLICATIONS

This application is a continuation of and claims priority to PCT patent application PCT/KR2012/002179 filed on Mar. 26, 2012, which claims priority to Korea Patent Application No. 10-2011-0047538 filed on May 19, 2011. The contents of both such applications are incorporated by reference herein.

BACKGROUND

1. Field of the Invention

The present invention relates plasma apparatuses and, more particularly, to an inductively coupled plasma apparatus including a power distribution unit to distribute power to a plurality of antennas for generating inductively coupled plasma.

2. Description of the Related Art

Inductively coupled plasma may generate high-density plasma, but it is not easy to generate large-area plasma of uniform density.

SUMMARY

Embodiments of the present invention provide a plasma apparatus using a power distribution unit having the shape of coaxial cable.

A plasma generation apparatus according to an embodiment of the present invention may include a vacuum container; a plurality of dielectrics connected to through-holes formed in the vacuum container; a plurality of RF coils of the same structure, which are disposed in the vicinity of the respective dielectrics and are electrically connected in parallel; an RF power source to supply power to the RF coils; an impedance matching circuit disposed between the RF power source and the RF coils; and a power distribution unit disposed between the impedance matching circuit and one ends of the RF coils to distribute the power of the RF power source to the RF coils. The power distribution unit includes a power distribution line and a conductive outer cover enclosing the power distribution line. Distances between an input end of the power distribution unit and the RF coils are equal to each other, and the other ends of the RF coils are connected to the conductive outer cover to be grounded.

In an exemplary embodiment of the present invention, the plasma generation apparatus may further include permanent magnets that are spaced apart from the RF coils, respectively.

In an exemplary embodiment of the present invention, the plasma generation apparatus may further include a magnet fixing plate to fix the permanent magnets and adjust a vertical distance between the permanent magnet and the RF coils.

In an exemplary embodiment of the present invention, the vacuum container may include a top plate in the form of quadrangular plate, and the RF coils may be arranged on the top plate in a matrix.

In an exemplary embodiment, the dielectrics may be one of the form of a shape of cylinder, bell jar or circular plate.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION

Figure 1A:
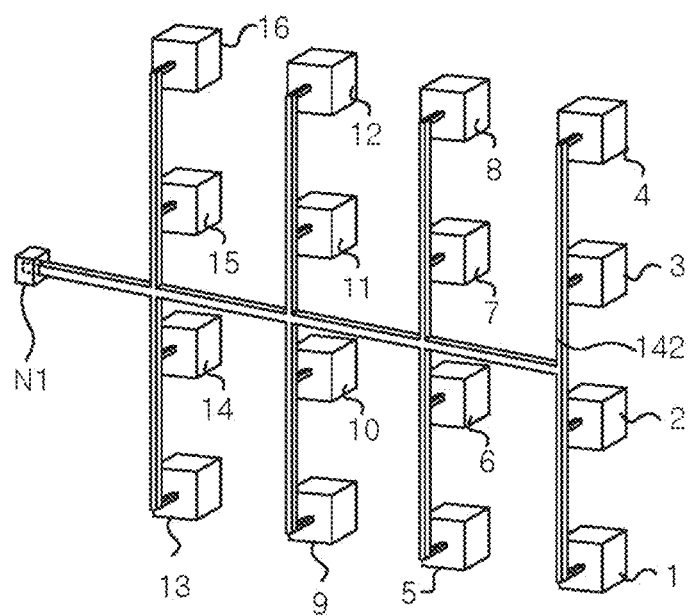
FIG. 1A is a perspective view of a conventional power distribution unit.

In order to generate large-area plasma, a single power source may supply power to a plurality of antennas or coils. In this case, the antennas may be connected in parallel or series to each other. However, it is difficult to ensure plasma uniformity. As the frequency of an RF power source increases, quasi-static approximation is not often correct. Thus, electromagnetic wave effect (EM wave effect) occurs.

According to an embodiment of the present invention, a power distribution unit for distributing power of an RF power source to antennas is configured to have the same length for all the antennas. In addition, the power distribution unit may have the shape of coaxial cable and may distribute equal power to the antennas. That is, the power distribution unit includes a power source distribution line and a grounded conductive outer cover enclosing the power distribution line. Distances between an input end of the power distribution unit and the antennas are equal to each other.

Exemplary embodiments of the present invention will now be described more fully with reference to the accompanying drawings, in which exemplary embodiments of the present invention are shown. Exemplary embodiments of the present invention may, however, be embodied in many different forms and should not be construed as limited to the embodiments set forth herein. Rather, these exemplary embodiments of the present invention are provided so that this description will be thorough and complete, and will fully convey the concept of exemplary embodiments of the present invention to those of ordinary skill in the art. In the drawings, the sizes and relative sizes of elements may be exaggerated for clarity. Like numerals refer to like elements throughout.

Figure 1B:
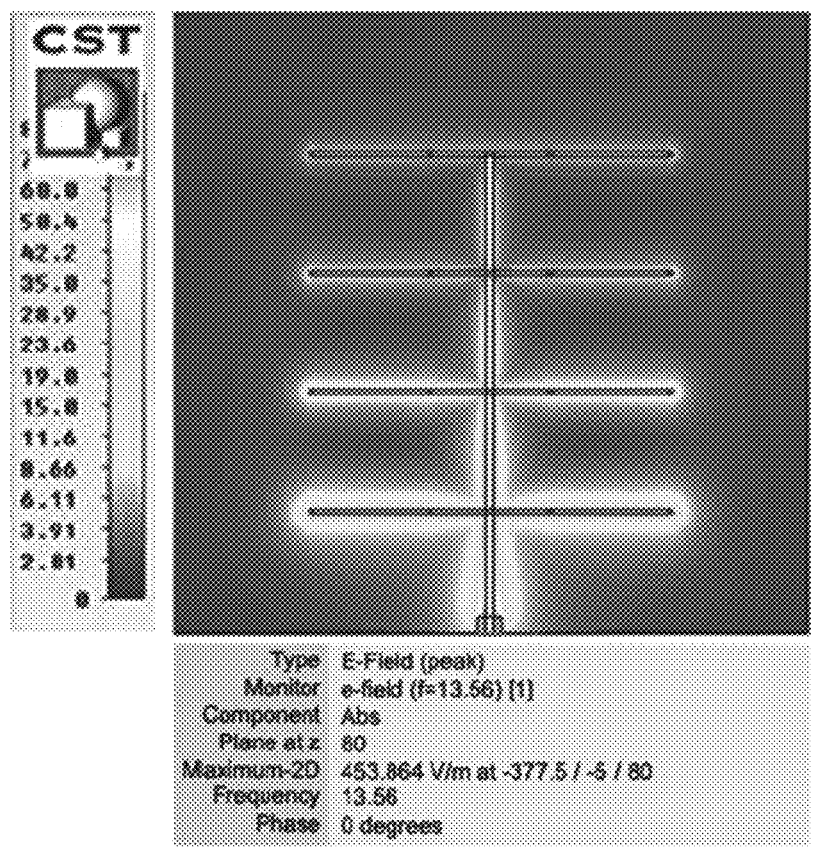
FIG. 1B illustrates the intensity of an electric field established by the power distribution unit in FIG. 1A.
Figure 1C:
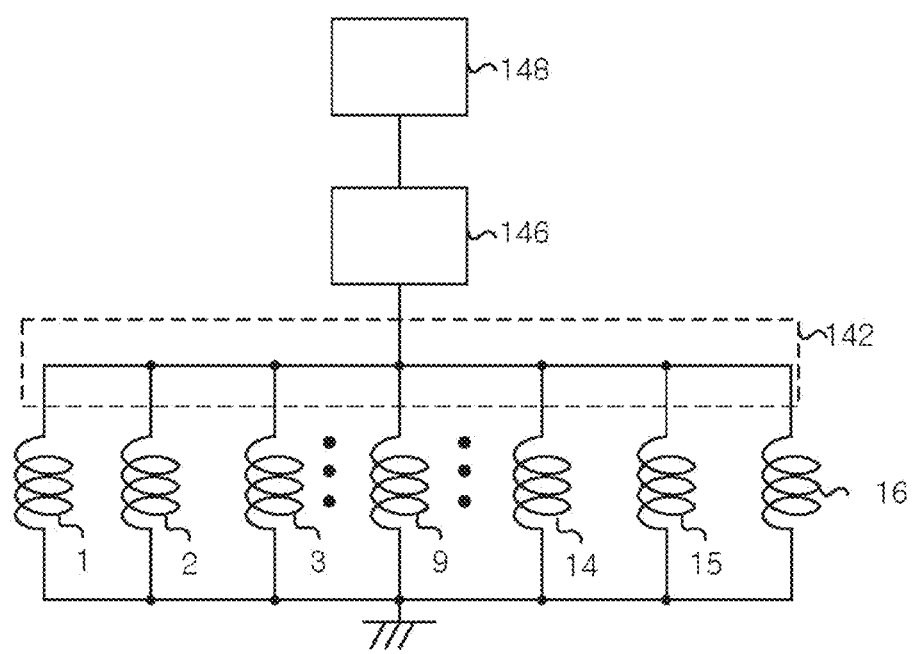
FIG. 1C is a circuit diagram of FIG. 1A.

FIG. 1A is a perspective view of a conventional power distribution unit. FIG. 1B illustrates the intensity of an electric field established by the power distribution unit in FIG. 1A, and FIG. 1C is a circuit diagram of FIG. 1A.

Referring to FIGS. 1A and 1B, a power distribution unit 142 distributes power of an RF power source 148 to 16 RF coils 1~16. A frequency of the RF power source 148 is 13.56 MHz. The power of the RF power source 148 is supplied to the power distribution unit 142 through an impedance matching network 146. The intensity of an electric field was calculated using electromagnetic simulation.

The power is supplied from the RF power source 148 at an input end N1 of the power distribution unit 142. The RF coils 1~16 are connected in parallel to each other. Distances between the input end N1 and the RF coils 1~16 are different from each other. The power distribution unit 142 is a conductor. The intensity of an electric field is high at the input end N1. The intensity of an electric field supplied to the RF coils 1 and 4 far away from the input end N1 is low. For this reason, the power distribution unit 142 cannot uniformly distribute the power to the RF coils 1~16.

Figure 2A:
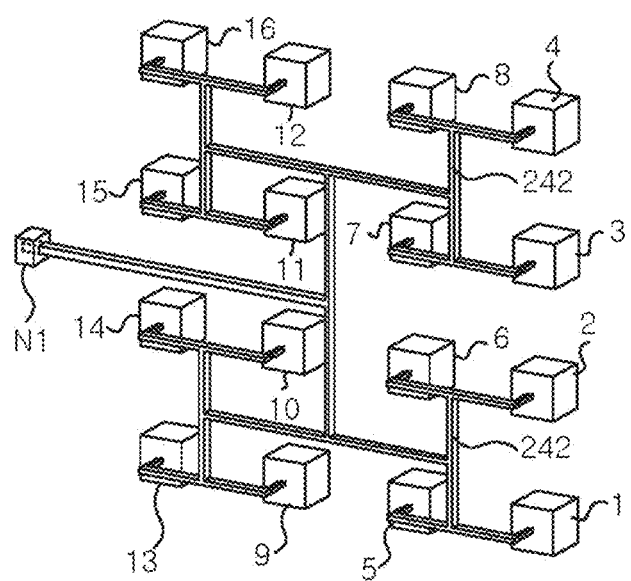
FIG. 2A is a perspective view of a conventional power distribution unit.
Figure 2B:
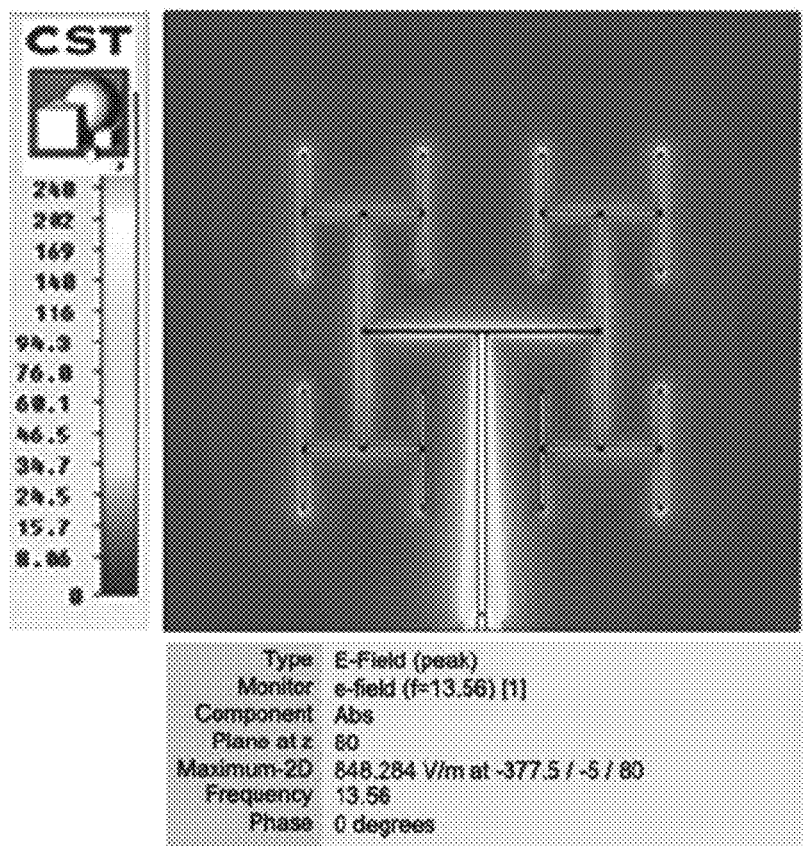
FIG. 2B illustrates the intensity of an electric field established by the power distribution unit in FIG. 2A.

FIG. 2A is a perspective view of a conventional power distribution unit, and FIG. 2B illustrates the intensity of an electric field established by the power distribution unit in FIG. 2A.

Referring to FIGS. 2A and 2B, a power distribution unit 242 is configured such that 16 RF coils 1~16 have the same length at an input end N1. A frequency of an RF power source is 13.56 MHz. However, the intensity of an electric field is high at the input end N1 of the power distribution unit 242 and decreases as it goes far away from the input end N1 of the power distribution unit 242. For this reason, the power distribution unit 242 cannot uniformly distribute power to the RF coils 1~16.

Figure 3A:
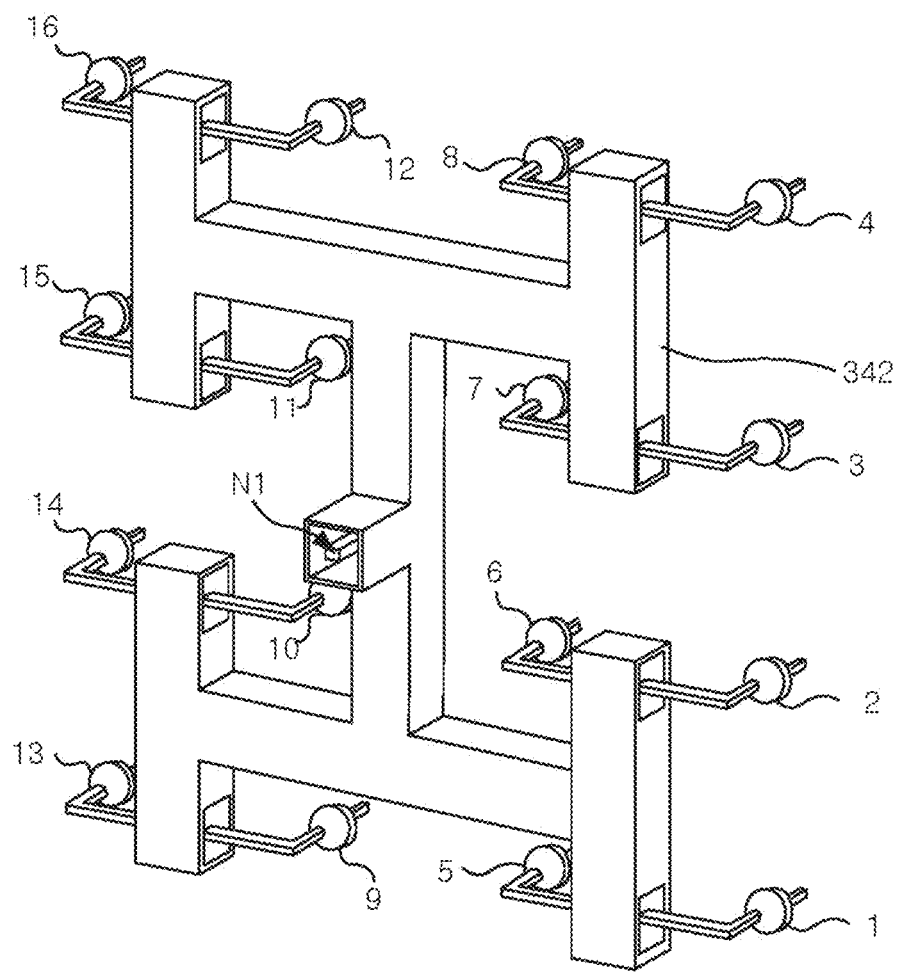
FIG. 3A is a perspective view of a conventional power distribution unit.
Figure 3B:
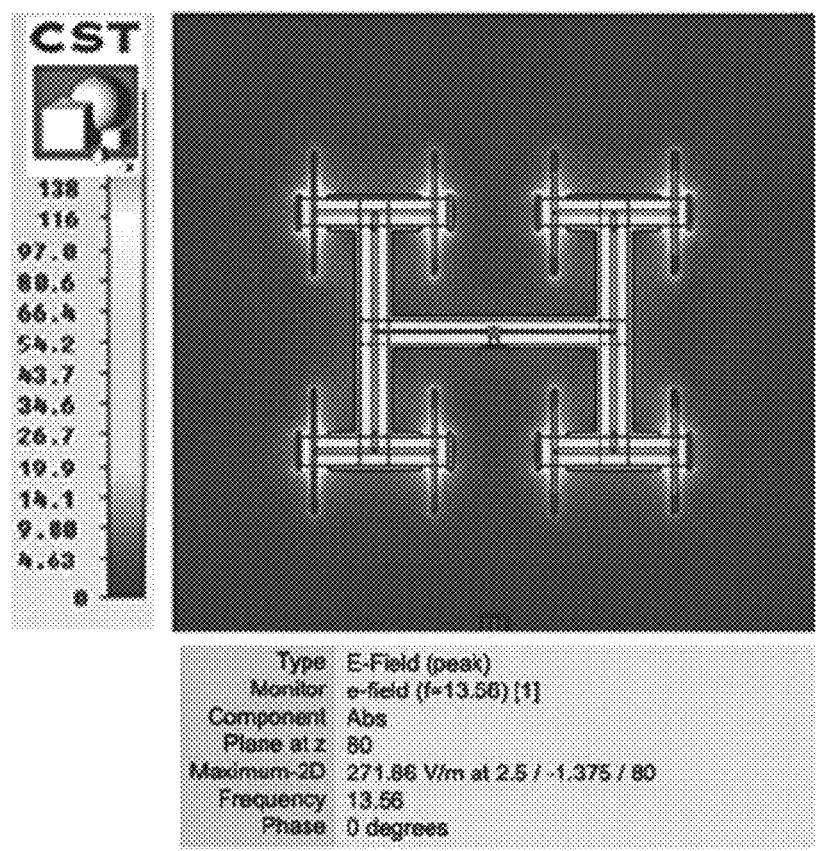
FIG. 3B illustrates the intensity of an electric field established by the power distribution unit in FIG. 3A.

FIG. 3A is a perspective view of a conventional power distribution unit. FIG. 3B illustrates the intensity of an electric field established by the power distribution unit in FIG. 3A, and FIG. 3C illustrates a voltage of an RF coil connected to the power distribution unit in FIG. 3A.

Figure 3C:
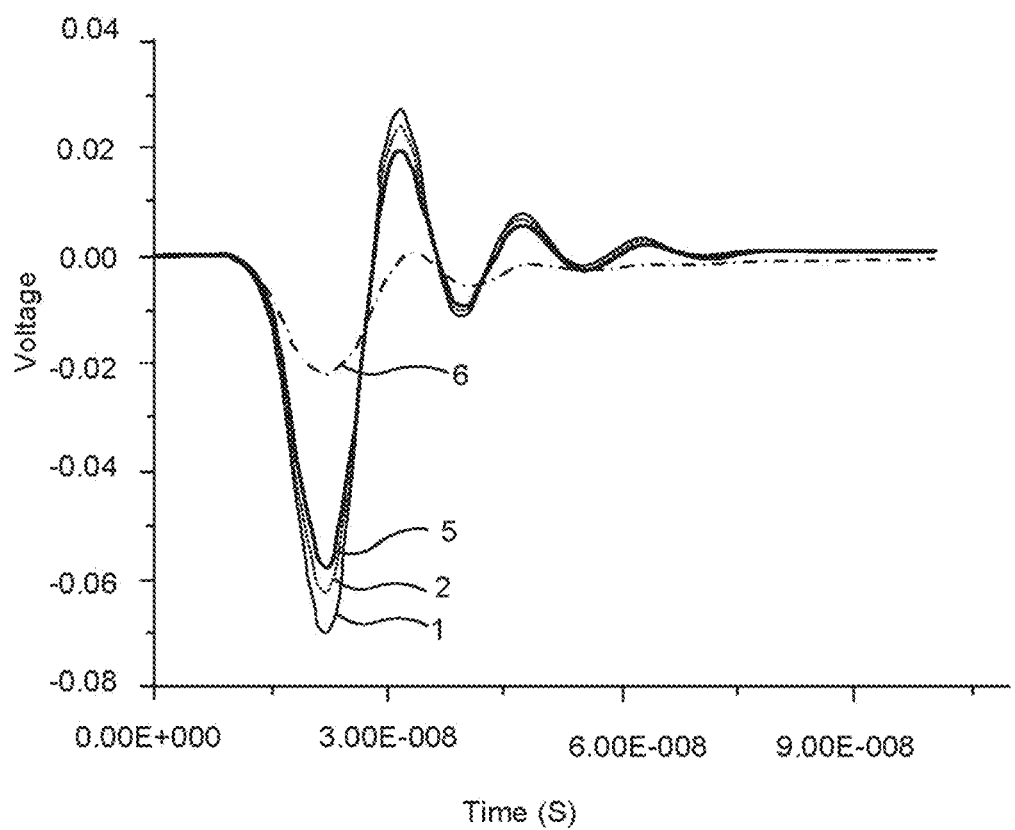
FIG. 3C illustrates a voltage of an RF coil connected to the power distribution unit in FIG. 3A.

Referring to FIGS. 3A to 3C, an RF power source distributes power to 16 RF coils 1~16 connected in parallel to each other through a power distribution unit 342. A frequency of the RF power source is 13.56 MHz. The power distribution unit 342 includes a power distribution line and a conductive outer cover enclosing the power distribution line. Accordingly, the power distribution unit 342 has the shape of coaxial cable. Distances between an input end N1 and the RF coils 1~16 are equal to each other.

One ends of the RF coils 1~16 are connected to the power distribution line, and the other ends of the RF coils 1~16 are connected to a plate-shape base to be grounded. Even in this case, voltages applied to the RF coils 1~16 vary depending on their positions.

Referring to FIG. 3C, voltages applied to the first, second, fifth, and sixth RF coils are different from each other. For this reason, the power distribution unit 342 cannot uniformly distribute power to the RF coils 1~16.

Figure 4A:
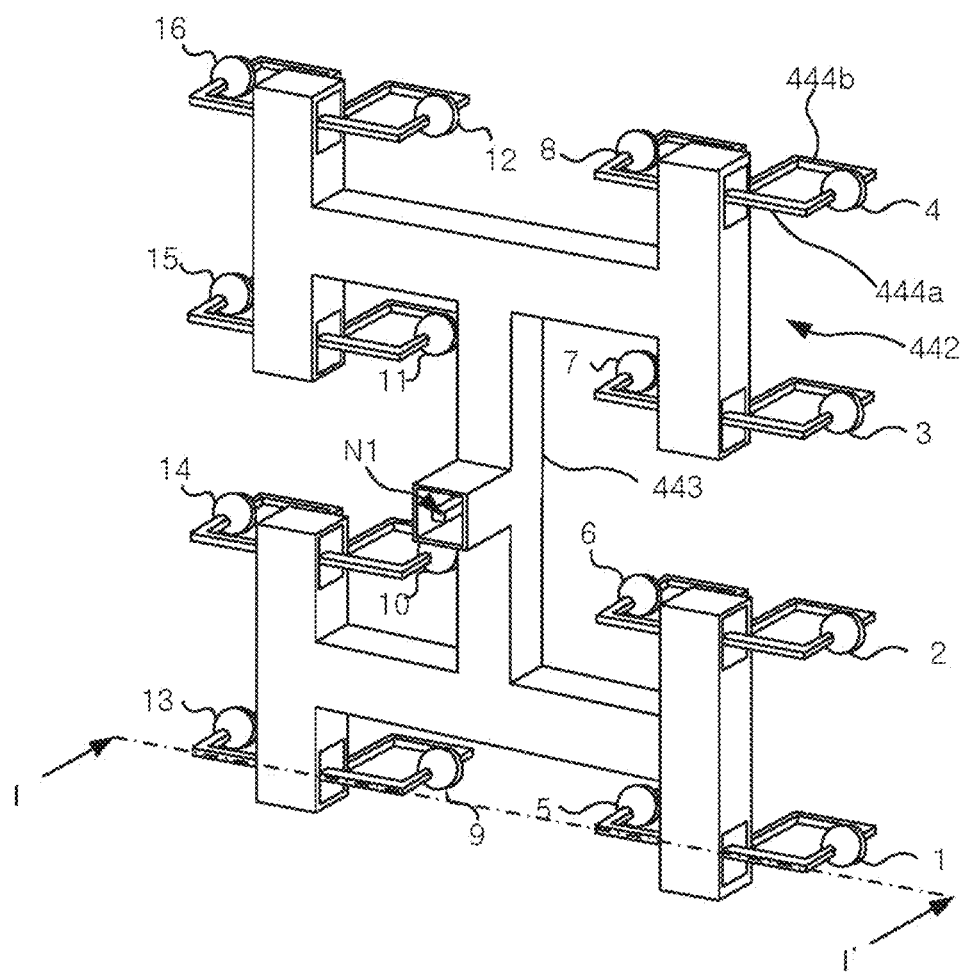
FIG. 4A is a perspective view of a power distribution unit according to an embodiment of the present invention.
Figure 4B:
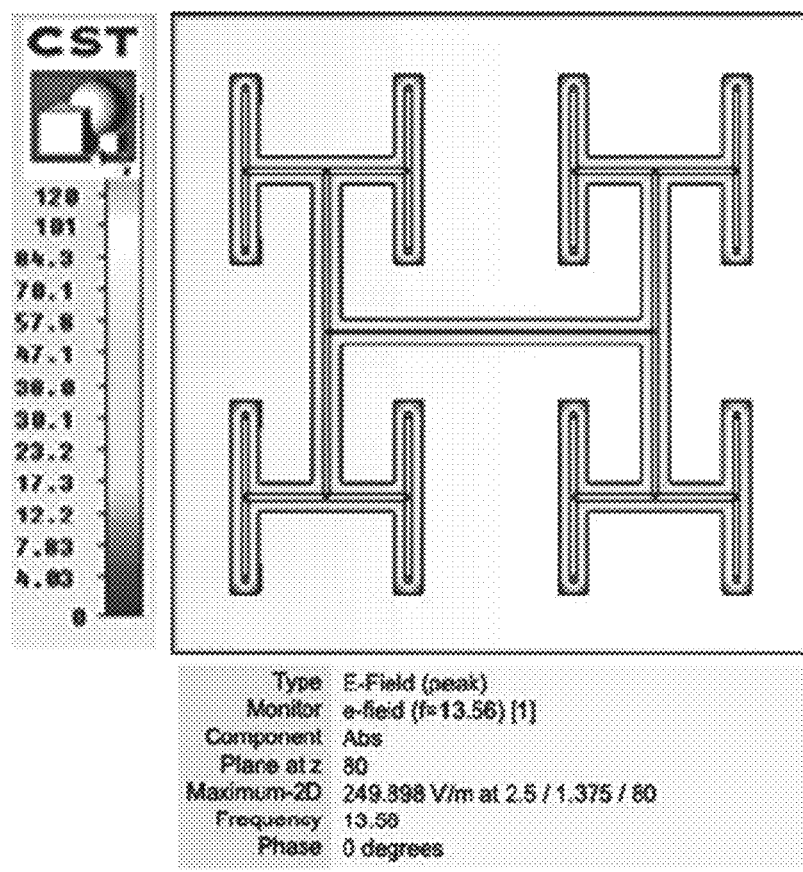
FIG. 4B illustrates the intensity of an electric field established by the power distribution unit in FIG. 4A.
Figure 4C:
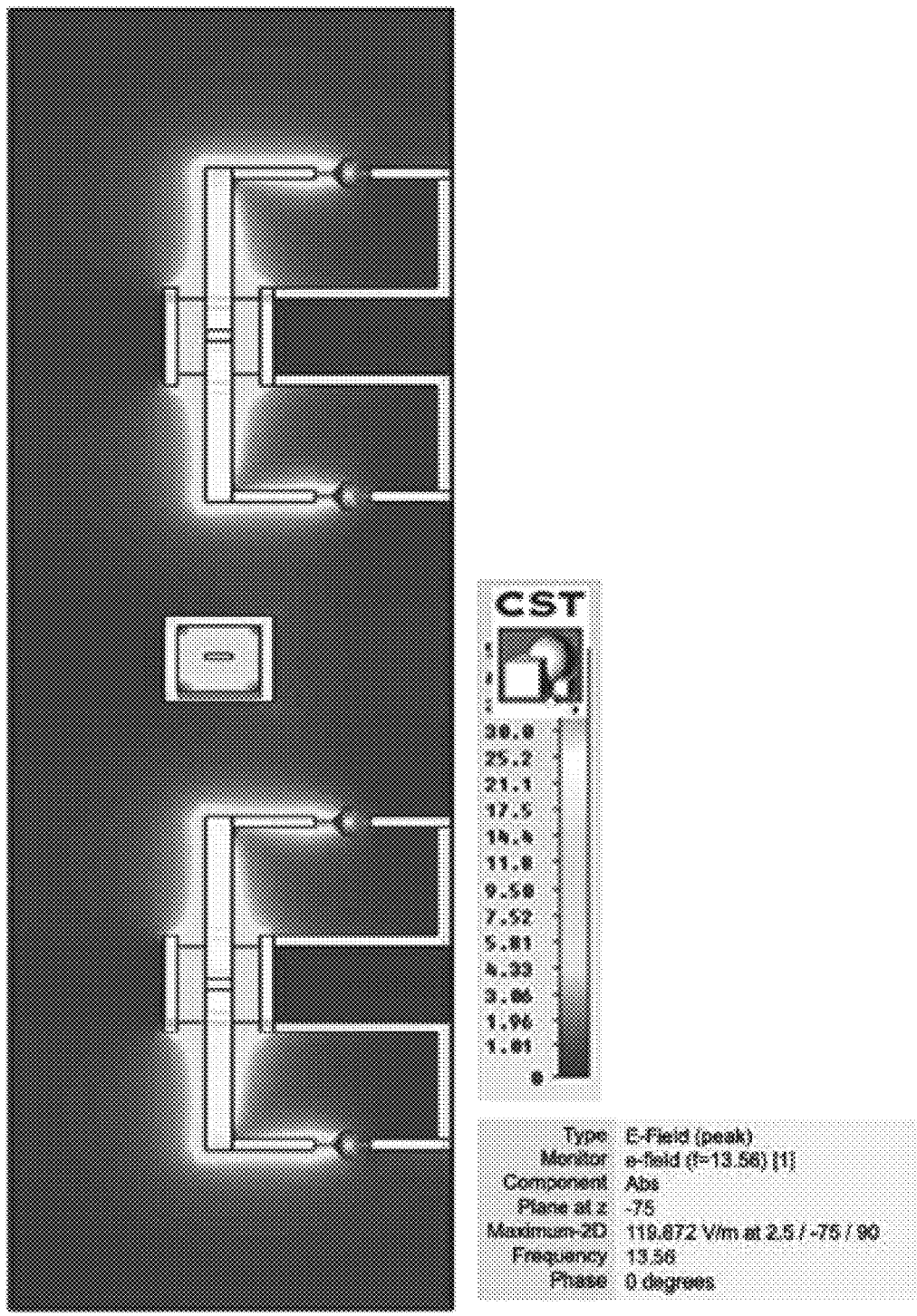
FIG. 4C illustrates the intensity of an electric field in a cross section taken along the line I-I' in FIG. 4A.
Figure 4D:
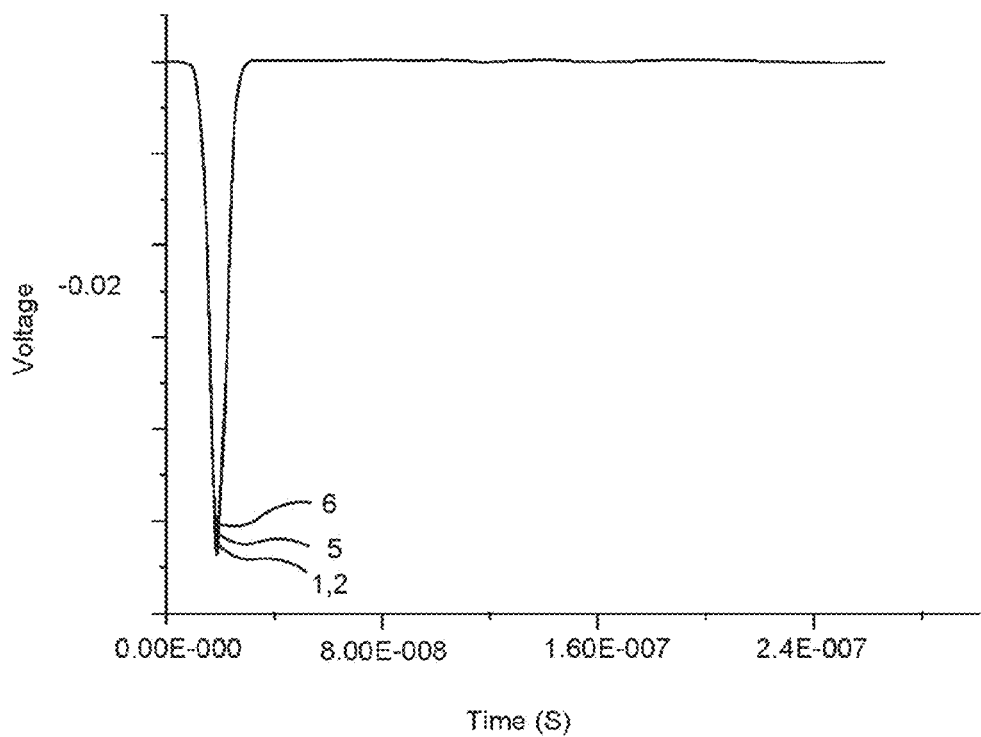
FIG. 4D illustrates voltages of RF coils connected to the power distribution unit in FIG. 4A.

FIG. 4A is a perspective view of a power distribution unit according to an embodiment of the present invention. FIG. 4B illustrates the intensity of an electric field established by the power distribution unit in FIG. 4A, and FIG. 4C illustrates the intensity of an electric field in a cross section taken along the line I-I' in FIG. 4A. FIG. 4D illustrates voltages of RF coils connected to the power distribution unit in FIG. 4A.

Referring to FIGS. 4A to 4D, an RF power source distribute power to 16 RF coils 1~16 connected in parallel to each other through a power distribution unit 442. A frequency of the RF power source is 13.56 MHz. The power distribution unit 442 includes a power distribution line (not shown) and a conductive outer cover 443 enclosing the power distribution line. Accordingly, the power distribution unit 442 has the shape of coaxial cable. One ends of the RF coils 1~16 are connected to the power distribution line through first connection means 444a, and the other ends of the RF coils 1~16 are connected to the conductive outer cover 443 through second connection means 444b having the same length to be grounded. In this case, voltages applied to the RF coils 1~16 are identical to each other depending on their positions. For this reason, inductively coupled plasma which is formed by a plurality of antennas or RF coils connected in parallel to each other may be uniform. The inductively coupled plasma may include Helicon plasma including an electromagnet or a permanent magnet.

Figure 5A:
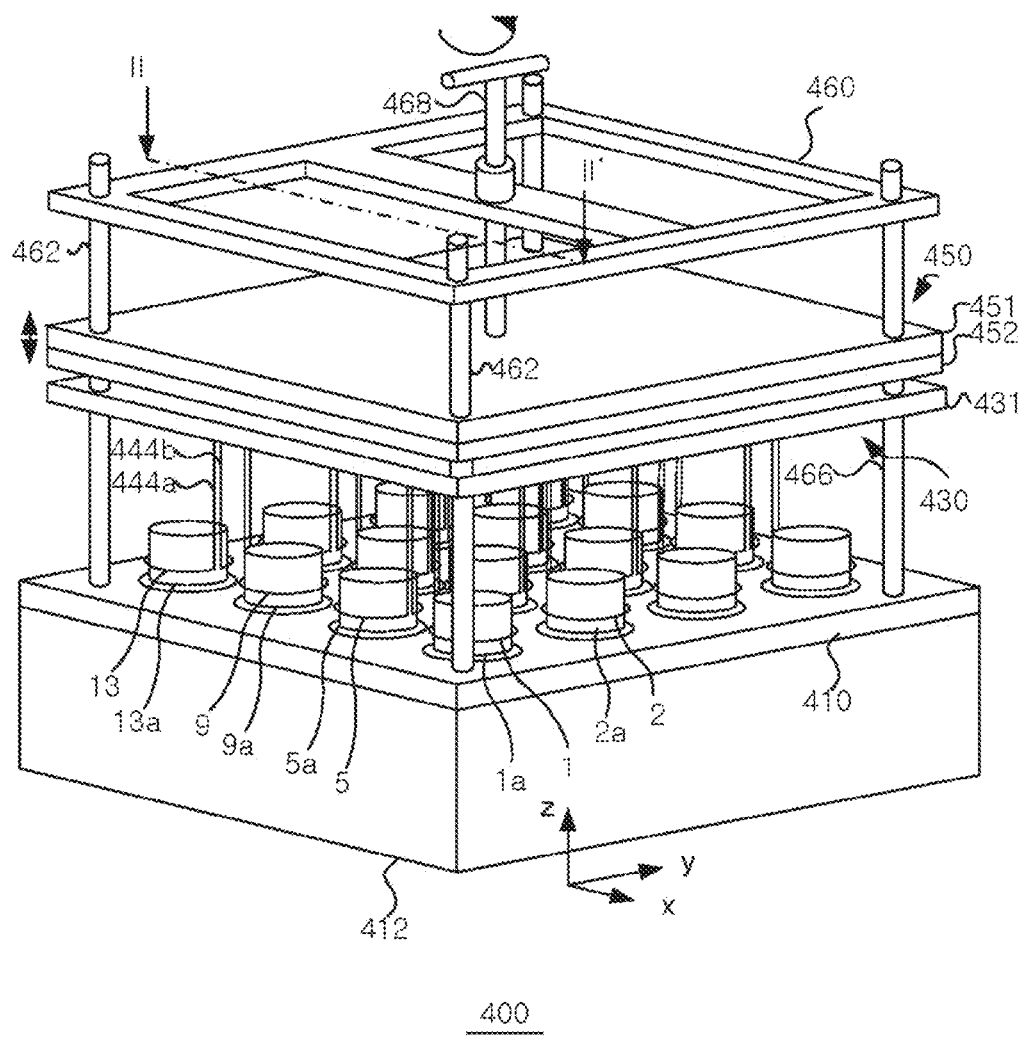
FIG. 5A is a perspective view of a plasma generation apparatus according to an embodiment of the present invention.
Figure 5B:
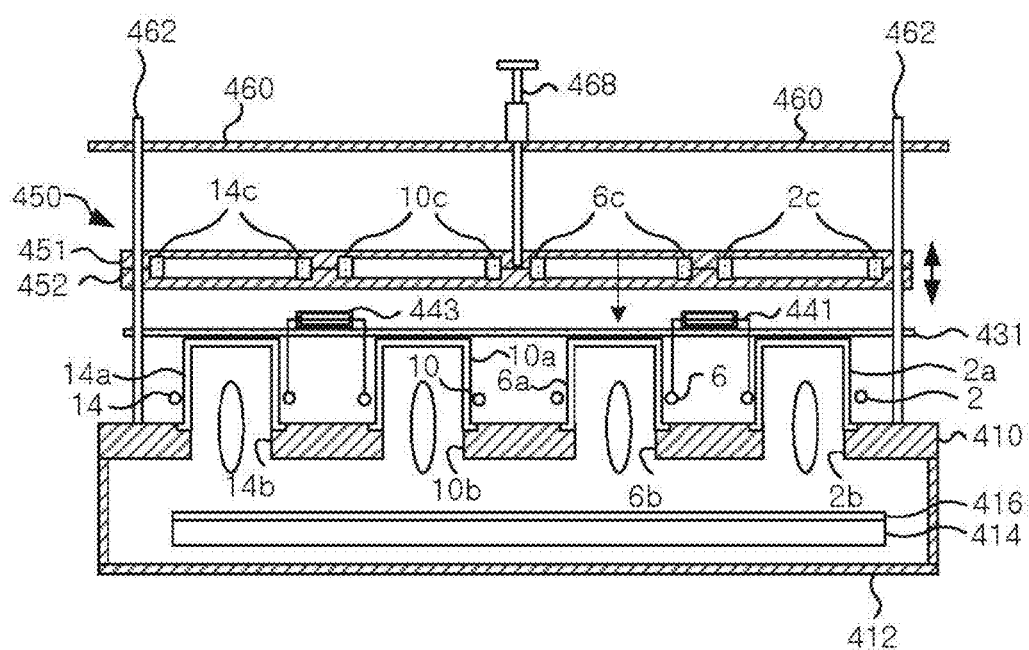
FIG. 5B is a cross-sectional view taken along the line II-II' in FIG. 5A.
Figure 5C:
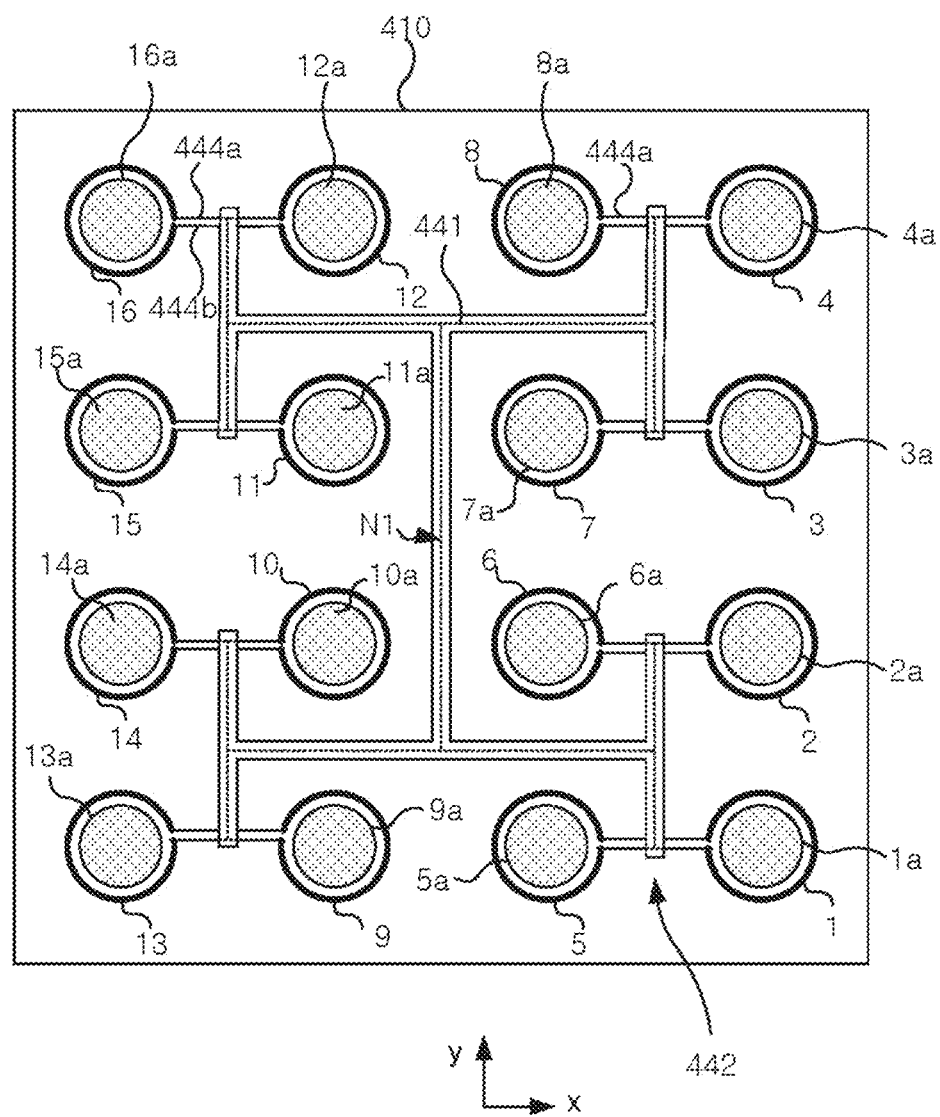
FIG. 5C is a top plan view of FIG. 5A.

FIG. 5A is a perspective view of a plasma generation apparatus according to an embodiment of the present invention. FIG. 5B is a cross-sectional view taken along the line II-II' in FIG. 5A, and FIG. 5C is a top plan view of FIG. 5A. In FIGS. 5A to 5C, sections different from FIGS. 4A to 4D will be extensively described to avoid duplicate description.

Referring to FIGS. 5A to 5C, a plasma generation apparatus 400 includes a vacuum container 412, a plurality of dielectrics 1a~16a connected to through-holes 2b, 6b, 10b, and 14b formed in the vacuum container 412, a plurality of RF coils 1~16 of the same structure that are disposed in the vicinity of the respective dielectrics 1a~16a and are electrically connected in parallel, an RF power source (not shown) to supply power to the RF coils 1~16, an impedance matching circuit (not shown) disposed between the RF power source and the RF coils 1~16, and a power distribution unit 442 disposed between the impedance matching circuit and one ends of the RF coils 1~16 to distribute the power of the RF power source to the RF coils 1~16.

The power distribution unit includes a power distribution line 441 and a conductive outer cover 443 enclosing the power distribution line. Distances between an input end N1 of the power distribution unit and the RF coils 1~16 are equal to each other, and the other ends of the RF coils 1~16 are connected to the conductive outer cover 443 with the same length to be grounded.

The vacuum chamber 412 may have a cylindrical shape or a square-tube shape. The vacuum chamber 412 may include a gas supply unit (not shown) to supply a gas and an exhaust unit (not shown) to exhaust a gas. The vacuum chamber 412 may include a substrate holder 414 and a substrate 416 mounted on the substrate holder 414. The RF coils 1~16 establish an electric field and a magnetic field passing through a dielectric. The electric field generates plasma inside the vacuum container 412 or the dielectric. That is, the RF coils 1~16 generate inductively coupled plasma. The RF coils 1~16 may generate plasma and radicals, and the radicals and/or plasma may process the substrate 416.

The vacuum chamber 412 may include a top plate 410 which is attachable/removable to the vacuum chamber 412. The top plate 410 may be in the form of a quadrangular plate. The top plate 410 may be made of a metal or a metal-alloy. The top plate 410 may include a plurality of through-holes corresponding to the number of the dielectrics 1a~16a. The dielectric may be disposed on the through-hole to form a discharge space. The dielectric may be in the form of tube or bell jar.

The dielectrics 1a~16a is disposed on the through-hole to provide a discharge space. A vacuum state of the dielectric may be kept by an O-ring inserted into a groove formed in the vicinity of an upper sidewall of the through-hole. The shape of the dielectric may be variously changed.

According to a modified embodiment of the present invention, the dielectrics 1a~16a may be dielectric tubes. One ends of the dielectric tubes may be connected to the vacuum chamber 412. A metal lid (not shown) may be mounted on the other ends of the dielectric tubes. The metal lid may include a gas introduction unit to introduce a gas. The metal lid may reflect a Helicon wave to cause a constructive interference. Thus, plasma may have higher density.

An output of the RF power source may be provided to the RF coils 1~16 through an impedance matching circuit (not shown). A frequency of the RF power source may be hundreds of kilohertz (kHz) to hundreds of megahertz (MHz).

The power distribution unit 442 may provide the output of the impedance matching circuit to the RF coils 1~16 connected in parallel to each other. The power distribution unit 442 may be disposed between the RF coils 1~16 and a movement unit 450. The power distribution unit 442 may provide parallel connection to the RF coils 1~16. The power distribution unit 442 may be implemented using a conventional coaxial cable and a T-shaped connector to connect the coaxial cable.

The power distribution line 441 may be copper having superior conductivity. A characteristic impedance of the power distribution unit 442 may be designed with 50 ohms. The conductive outer cover 443 may be a conductive material. The conductive outer cover 443 may be formed by processing a metal sheet material or using a metal net. An insulating material may be interposed between the conductive outer cover 443 and the power distribution line.

If the power distribution unit 442 is implemented using a conventional coaxial cable, the power distribution unit 442 may have a T-shaped branch. Distances between an input end of the power distribution unit 442 and the RF coils 1~16 are equal to each other, the other ends of the RF coils 1~16 are connected to the conductive outer cover 443 with the same length to be grounded.

A support plate 431 may be disposed below the power distribution unit 442 to support the power distribution unit 442. The support plate 431 may be an insulator or a conductor. First connection means 444a connects the power distribution line 441 to one ends of the RF coils 1~16 through through-holes formed in the support plate 431. Preferably, the connection means 444a is short in length. Second connection means 444b connects the other ends of the RF coils 1~16 to the conductive outer cover 443. Thus, the RF coils 1~16 may have the same impedance characteristics.

The RF coils 1~16 may be formed using a pipe. A coolant may cool the RF coils 1~16 while flowing through the insides of the RF coils 1~16. One ends of the RF power coils 1~16 may be connected to the power distribution line through the first connection means 444a. One ends of the RF coils 1~16 may be connected to the RF power source through the power distribution line, and the other ends of the RF coils 1~16 may be connected to the conductive outer cover 443 through the second connection means 444b to be grounded. The RF coils 1~16 may be arranged in a matrix.

The RF coils 1~16 may be a three-turn antenna or a one-turn antenna. Plasma generated by the RF coils 1~16 may be Helicon mode plasma. The number of turns of the RF coils 1~16 may be adjusted due to impedance matching. For example, when an inductance value of the RF coils 1~16 is too great, the number of turns of the RF coils 1~16 may decrease to two or one.

Each of permanent magnets 1c~16c may have a donut or toroidal shape. A cross section of each of the permanent magnets 1c~16c may be quadrangular or circular. A main direction of the magnetic field established by the permanent magnets 1c~16c may be perpendicular to a plane on which the permanent magnets 1c~16c are disposed. There may be one or more planes on which the permanent magnets 1c~16c are disposed.

The movement unit 450 may include at least one support pillar 462 fixedly connected to the vacuum chamber 412 and extending perpendicularly to a plane on which the dielectrics 1a~16a are disposed, magnet fixing plates 451 and 452 inserted into the support pillar 462 to be movable along the support pillar 462, and an upper support plate 460 inserted into the support pillar 462 to fix the support pillar 462.

The permanent magnets 1c~16c may be fixed to the magnet fixing plates 451 and 452. A movement shaft 468 may be included in the center of the magnet fixing plates 451 and 452. One end of the movement shaft 468 is fixed to the magnet fixing plates 451 and 452 via a bearing, and the other end of the movement shaft 468 may be disposed to penetrate the upper support plate 460.

The movement shaft 468 may have a screw shape, and the upper support plate 468 may include a nut shape. Accordingly, the magnet fixing plates 451 and 452 are vertically movable with the rotation of the movement shaft 468. As a result, vertical distances between the permanent magnets 1c~16c and the RF coils 1~16 may be adjusted.

The vertical distance between the permanent magnet and the RF coil may change the shape and intensity of a magnetic field. Thus, a density distribution of plasma established by the RF coil may be adjusted with changing of the vertical distance.

A shield unit (not shown) may be disposed between an outer side surface of the upper plate and an outer side surface of the upper support plate 460 to prevent an electromagnetic wave generated by the RF coils 1~16 from leaking out.

According to a modified embodiment of the present invention, the dielectric may be a circular plate. Thus, the RF coil may be disposed on the circular plate to establish inductively coupled plasma.

The inductively coupled plasma established by a plurality of antennas or RF coils 1~16 connected in parallel may be uniform due to power distribution of the power distribution unit 442.

Figure 6:
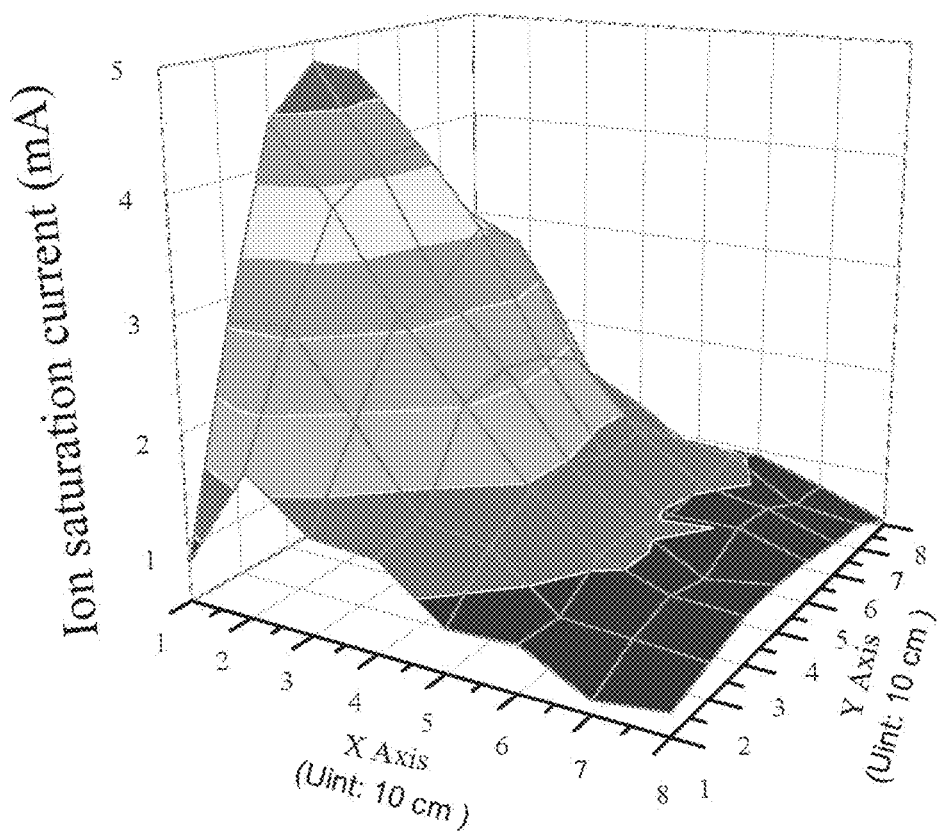
FIG. 6 illustrates a measure plasma density distribution using a power distribution unit having the shape show in FIG. 3A.

FIG. 6 illustrates a measured plasma density distribution using a power distribution unit having the shape shown in FIG. 3A.

Referring to FIGS. 3A and 6, similar to a result of computer simulation, RF coils cannot generate plasma with the same power. That is, some of the RF coils consume most of the power and the other RF coils cannot generate plasma. Thus, large-area uniform plasma could not be generated. The unit of x-axis is 10 centimeters (cm), and the unit of y-axis is 10 cm. The center position is x=4 and y=4. Accordingly, left RF coils mainly consumed the power.

Figure 7:
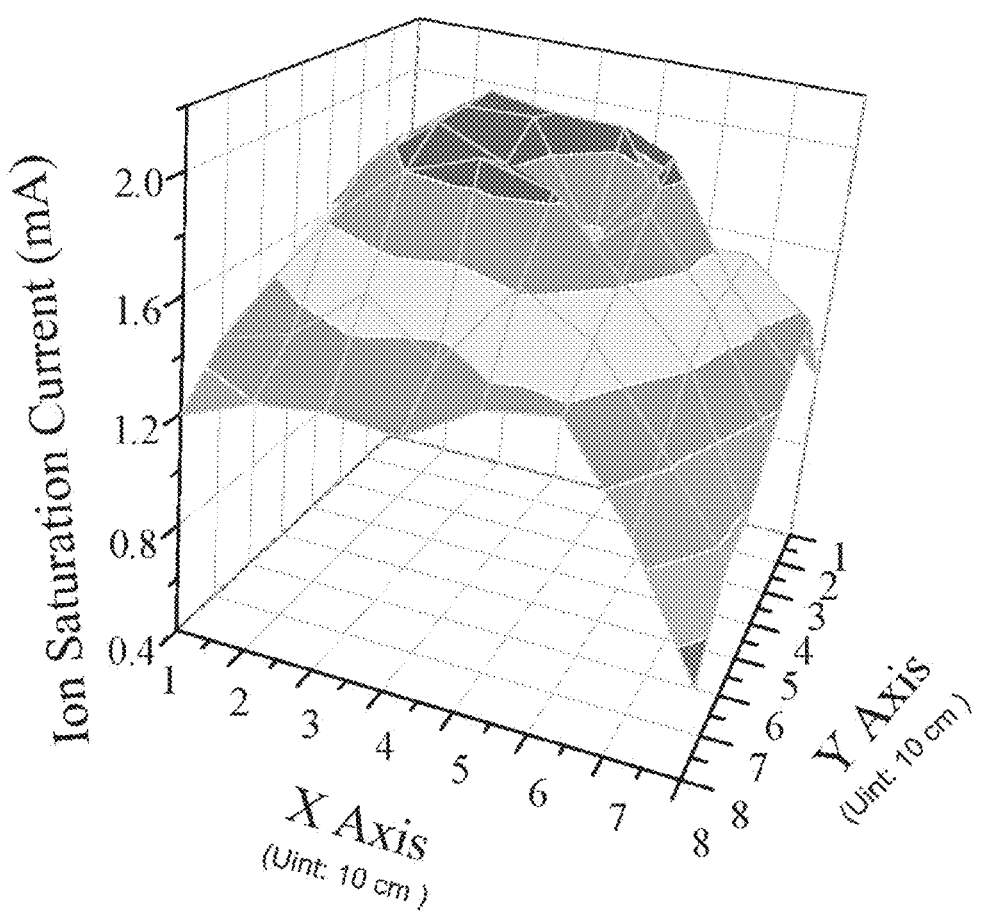
FIG. 7 illustrates a measured plasma density distribution using a power distribution unit having the structure shown in FIG. 4A.

FIG. 7 illustrates a measured plasma density distribution using a power distribution unit having the structure shown in FIG. 4A.

Referring to FIGS. 4A and 7, one ends of RF coils are connected to a power distribution line, and the other ends of the RF coils are connected to a conductive outer cover. Thus, the respective RF coils have the same impedance and the power distribution unit supplies equally-divided power to the RF coils. As can be seen from a result of test, all the RF coils generated plasma. Thus, large-area uniform plasma was generated. The unit of x-axis is 10 cm, and the unit of y-axis is 10 cm. The center position is x=4 and y=4.

Similar to a result of computer simulation, the RF coils consumed the same power to generate large-area uniform plasma.

As described so far, a plasma generation apparatus according to an embodiment of the present invention can uniformly distributes power to all RF coils connected in parallel to generate uniform inductively coupled plasma.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A plasma generation apparatus comprising:
    a vacuum container;
    a plurality of dielectrics connected to through-holes formed in the vacuum container;
    a plurality of RF coils of the same structure, which are disposed in the vicinity of the respective dielectrics and are electrically connected in parallel;
    an RF power source to supply power to the RF coils;
    an impedance matching circuit disposed between the RF power source and the RF coils; and
    a power distribution unit disposed between the impedance matching circuit and one ends of the RF coils to distribute the power of the RF power source to the RF coils,
    wherein the power distribution unit comprises:
        a power distribution line; and
        a conductive outer cover enclosing the power distribution line,
        wherein distances between an input end of the power distribution unit and the RF coils are distances between node points including an input node (N1) of the power distribution unit and RF coil nodes,
    further comprising:
        permanent magnets spaced apart from the RF coils, respectively, and
        a magnet fixing plate to fix the permanent magnets and adjust a vertical distance between the permanent magnets and the RF coils.

2. The plasma generation apparatus as set forth in claim 1, wherein each of the dielectrics is in the form of a shape of cylinder, bell jar, or cylindrical plate.

3. A plasma generation apparatus comprising:
    a vacuum container;
    a plurality of dielectrics connected to through-holes formed in the vacuum container;
    a plurality of RF coils of the same structure, which are disposed in the vicinity of the respective dielectrics and are electrically connected in parallel;
    an RF power source to supply power to the RF coils;
    an impedance matching circuit disposed between the RF power source and the RF coils; and
    a power distribution unit disposed between the impedance matching circuit and one ends of the RF coils to distribute the power of the RF power source to the RF coils,
    wherein the power distribution unit comprises:
        a power distribution line; and
        a conductive outer cover enclosing the power distribution line,
        wherein distances between an input end of the power distribution unit and the RF coils are distances between node points including an input node (N1) of the power distribution unit and RF coil nodes,
        wherein the vacuum container includes a to plate in the form of a quadrangular plate, and
        wherein the RF coils are arranged on the top plate in a matrix.

4. The plasma generation apparatus as set forth in claim 3, wherein each of the dielectrics is in the form of a shape of cylinder, bell jar or circular plate.

* * * * *